United States Patent [19]

Adalsteinsson et al.

[11] Patent Number: 5,652,516

[45] Date of Patent: Jul. 29, 1997

[54] SPECTROSCOPIC MAGNETIC RESONANCE IMAGING USING SPIRAL TRAJECTORIES

[75] Inventors: Elfar Adalsteinsson, Stanford, Calif.; Pablo Irarrazabal, Santiago, Chile

[73] Assignee: The Board of Trustees of the Leland Stanford Junior University, Palo Alto, Calif.

[21] Appl. No.: 589,148

[22] Filed: Jan. 22, 1996

[51] Int. Cl.[6] .................................................... G01V 3/00
[52] U.S. Cl. ............................................ 324/309; 324/307
[58] Field of Search .................................... 324/309, 307, 324/306, 314, 300

[56] References Cited

U.S. PATENT DOCUMENTS

| Re. 32,712 | 7/1988 | Likes | 324/307 |
|---|---|---|---|
| 4,509,015 | 4/1985 | Ordidge et al. | 324/309 |
| 4,588,948 | 5/1986 | Mansfield | 324/309 |
| 4,651,096 | 3/1987 | Buonocore | 324/309 |
| 4,691,162 | 9/1987 | Van Uijen | 324/309 |
| 4,748,410 | 5/1988 | Macovski | 324/309 |
| 4,797,616 | 1/1989 | Matsui et al. | 324/309 |
| 5,258,711 | 11/1993 | Hardy | 324/309 |
| 5,270,653 | 12/1993 | Pauly | 324/309 |
| 5,402,067 | 3/1995 | Pauly et al. | 324/309 |
| 5,532,595 | 7/1996 | Lampman et al. | 324/309 |

OTHER PUBLICATIONS

G. Morrell et al., "Fast spectroscopic imaging with time-varying gradients". Dept. Elec. Eng. Stanford Uni. Date of Publication Unknown.

J. O'Sullivan, "A fast sinc function gridding algorithm for fourier inversion in computer tomography." *IEEE Transactions on Medical Imaging*, MI-4:4 (Dec. 1985).

Primary Examiner—Louis M. Arana
Attorney, Agent, or Firm—Townsend and Townsend and Crew LLP; Henry K. Woodward

[57] ABSTRACT

Disclosed is a rapid data acquisition method that applies spiral-based k-space trajectories to spectroscopic imaging. In contrast to conventional acquisition methods, this technique offers independent control over imaging time and spatial resolution. The rapid scan enables the acquisition of spectroscopic data from three spatial dimensions in the same time that conventional methods acquire a single slice. This three-dimensional acquisition delivers an order of magnitude more data than the conventional methods, with no loss in SNR. In addition to three-dimensional spectroscopic imaging, other applications of the rapid k-space scanning with spiral trajectories are described. Sophisticated acquisition methods based on multiple-quantum editing can be incorporated into spectroscopic imaging sequences without a loss in SNR. These editing methods have shown particular promise in the detection of the important lactate signal in the presence of strong, undesired lipid signals. More generally, any combination of RF and gradient waveforms can precede the spectroscopic readout, as long as it excites transverse magnetization for the desired metabolites and suppresses the undesired water and lipid resonances. Rapid scans to acquire chemical-shift inhomogeneity information are also described, where a separate acquisition of the water and lipid signal is used to collect a robust and reliable map of the main field inhomogeneities.

12 Claims, 7 Drawing Sheets

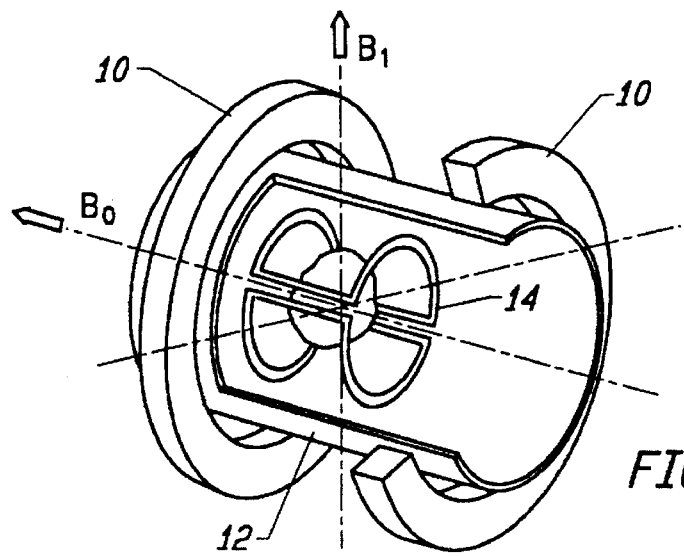
FIG. 1A
FIG. 1B    FIG. 1C    FIG. 1D
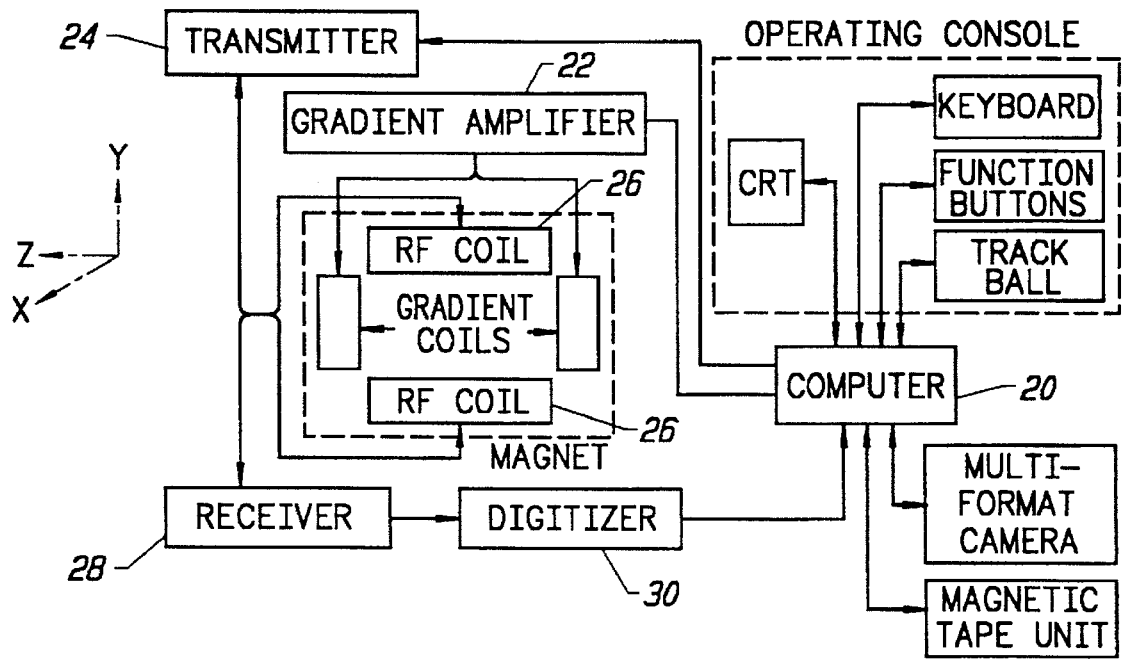
FIG. 2

SPECTROSCOPIC MAGNETIC RESONANCE IMAGING USING SPIRAL TRAJECTORIES

This invention was made using funding under National Institute of Health grant number CA48269 to Stanford University. The U.S. Government has rights in the invention.

BACKGROUND OF THE INVENTION

This invention relates generally to magnetic resonance spectroscopy imaging (MRSI) and, more particularly, the invention relates to a method and apparatus for rapid data acquisition in MRSI.

Nuclear magnetic resonance (NMR) spectroscopy is a method that is used to study the structure and dynamics of molecules. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils.

Referring to the drawing, FIG. 1A is a perspective view partially in section illustrating coil apparatus in a MR imaging system, and FIGS. 1B–1D illustrate field gradients which can be produced in the apparatus of FIG. 1A. This apparatus is discussed by Hinshaw and Lent, "An Introduction to NMR Imaging: From the Block Equation to the Imaging Equation," Proceedings of the IEEE, Vol. 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A body undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in "NMR—A Perspective on Imaging," General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Spectroscopic imaging studies have traditionally been carried out with phase encoding techniques. These techniques sample the data on a rectilinear grid, and can be reconstructed directly by a fast Fourier transform (FFT). However, phase encoded acquisitions place severe restrictions on the relationship between scan time, resolution, and signal-to-noise ratio (SNR). The SNR of the metabolites of interest is very low, and thus it is of essence to design the acquisition for maximum SNR.

The present invention provides rapid data acquisition using spiral-bound k-space trajectories to spectroscopic imaging. In contrast to conventional MRSI acquisition methods, the invention allows independent control over imaging time and spatial resolution.

SUMMARY OF THE INVENTION

In accordance with the invention a rapid data acquisition method and apparatus applies spiral-based k-space trajectories to spectroscopic imaging. In contrast to conventional acquisition methods, this technique offers independent control over imaging time and spatial resolution. The rapid scan enables the acquisition of spectroscopic data from three spatial dimensions in the same time that conventional methods acquire a single slice. This three dimensional acquisition delivers an order of magnitude more data than the conventional methods with no loss in signal to noise ratio (SNR).

Briefly, the MRSI method in accordance with the invention includes placing an object to be imaged in a magnetic field aligned along an axis (Z), selectively exciting nuclei in the body to excite desired metabolites for imaging, and applying time varying gradients ($G_x$, $G_y$) along two axes to define a first plurality of spiral trajectories in k-space with the spiral trajectories extending along a frequency axis in k-space ($K_f$). Signals emitted from the metabolites are then detected.

The imaging steps are repeated with time varying gradients altered in time relative to the signal echo time whereby a second plurality of spiral trajectories in k-space is defined and which is interleaved with the first plurality of spiral trajectories. In accordance with another embodiment, a gradient pulse is applied along a third axis (Z) to define a plane orthogonal to axis in k-space ($K_z$) in which the plurality of spiral trajectories are located. The gradient along the third axis can be altered in phase for each repetition thereby defining a plurality of planes orthogonal to axis in k-space ($K_z$) in which each plurality of spiral trajectories are located. In accordance with a preferred embodiment the planes of spiral trajectories provide a spherical coverage in ($K_x$, $K_y$, $K_z$)-space.

The invention and objects and features thereof will be more readily apparent from the following detailed description and appended claims when taken with the drawings.

BRIEF DESCRIPTION OF THE DRAWINGS

FIGS. 1A–1D illustrate an arrangement of conventional MRI apparatus and magnetic fields generated therein.

FIG. 2 is a functional block diagram of MRI imaging apparatus.

DETAILED DESCRIPTION OF ILLUSTRATIVE EMBODIMENTS

The spiral based acquisition method in accordance with the invention is best described in terms of its k-space coverage. The trajectory samples data in four-dimensional k-space, $(k_x, k_y, k_z, k_f)$, as depicted schematically in FIGS. 3A–3C. The k-space dimensions constitute the Fourier space that corresponds to the three spatial dimensions, x, y, z, and one frequency (or chemical shift) dimension, f. Data is sampled along a k-space path whose $(k_x, k_y, k_z)$-coordinate is determined by the time integral of the gradient waveforms, $G_x$, $G_y$, $G_z$. The fourth k-space coordinate, $k_f$, equals time, t, where the time origin is defined as the echo time of the excitation sequence.

Figure 3A:
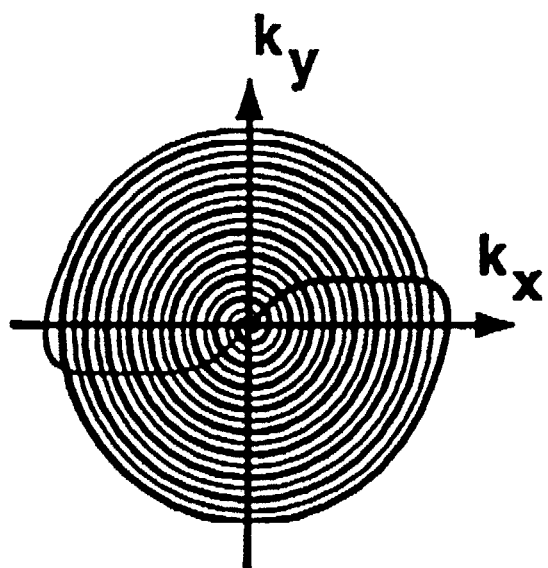
FIGS. 3A–3D illustrate a three-dimensional spectroscopic spiral k-space trajectory as used in the invention including respectively a spiral wave form followed by a path that takes the trajectory back to the origin, the beginning of the three dimensional path in $K_x$, $K_y$, $K_f$ space; stack of parallel planes in $K_x$, $K_y$, $K_z$ space; and a k-space trajectory in which a spiral is approximated by line segments.
Figure 3B:
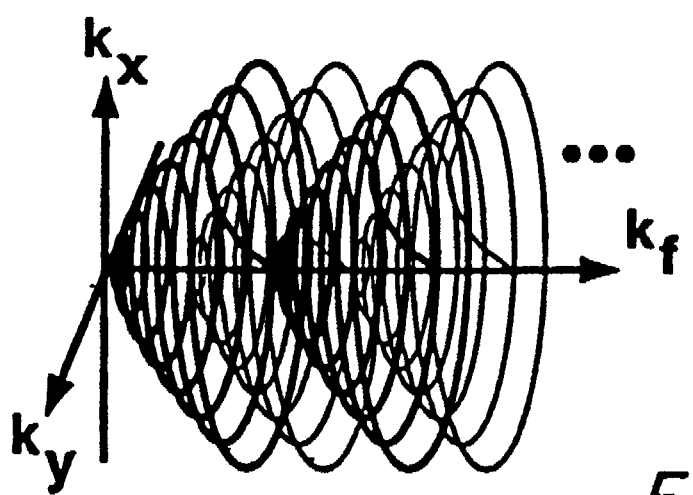

During the readout period, the time-varying gradients trace a spiral path in the $(k_x, k_y)$ plane as shown in FIG. 3A. The combination of the spiral and returning paths forms the basic element of the trajectory. This basic element is repeated throughout the entire readout interval, and thus it samples a three-dimensional trajectory $(k_x, k_y, k_f)$-space as depicted in FIG. 3B.

Figure 3C:
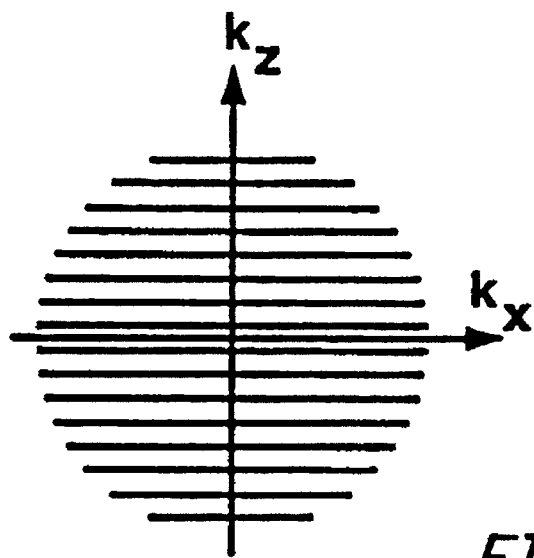

The $k_z$ dimension is sampled by preceding each readout by a phase encoding lobe along the z-gradient. The resulting trajectory in $(k_x, k_y, k_z)$-space is a stack of parallel planes that are orthogonal to the $k_z$ axis. While the data could be sampled on a stack of planes that form a cylinder in $(k_x, k_y, k_z)$-space, we chose to modify the sampling to a sphere in $(k_x, k_y, k_z)$-space. For each $k_z$ plane, the maximum extent of the spiral trajectory in the $(k_x, k_y)$ dimensions is chosen so that the $(k_x, k_y, k_z)$ coverage is spherical as depicted in FIG. 3C. This spherical k-space sampling minimizes the acquisition time, and achieves isotropic spatial impulse response. We note that the shape of the $(k_x, k_y, k_z)$ space sampling becomes an ellipsoid when the spatial resolution is not equal in all three spatial dimensions.

Figure 3D:
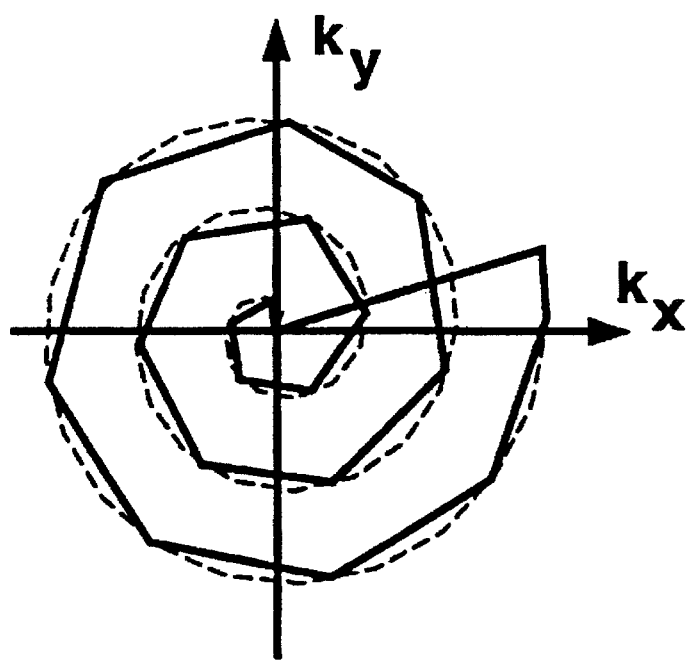

We note that the above trajectory can be implemented on systems that do not allow continuously varying gradient waveforms. As long as the spiral k-space path can be reasonably approximated with the limited gradient waveforms, for instance with series of connected line-segments as depicted in FIG. 3D, the trajectory described above can be applied.

Interleaving can be used to increase the field-of-view (FOV) in the spatial dimensions or the frequency dimension. For example, the spatial FOV in the x and y dimensions can be increased by interleaving the spiral trajectories as depicted with the thin curve in FIG. 3A. To increase the spectral band-width, the $(k_x, k_y, k_f)$ trajectory can be interleaved along the $k_f$ dimension, by delaying the start of the spiral gradient trajectory relative to the echo time as shown with the thin curve in FIG. 3B.

The sampled data along the spiral trajectories are not uniformly spaced, so that a Fast Fourier Transform (FFT) cannot be used directly for reconstruction. To reconstruct the data we first apply a gridding algorithm that re-samples the non-uniformly spaced data onto a regularly spaced grid. After the gridding, a four-dimensional FFT of the resampled, regularly spaced data provides spectroscopic images that are spatially resolved in three dimensions.

Figure 4:
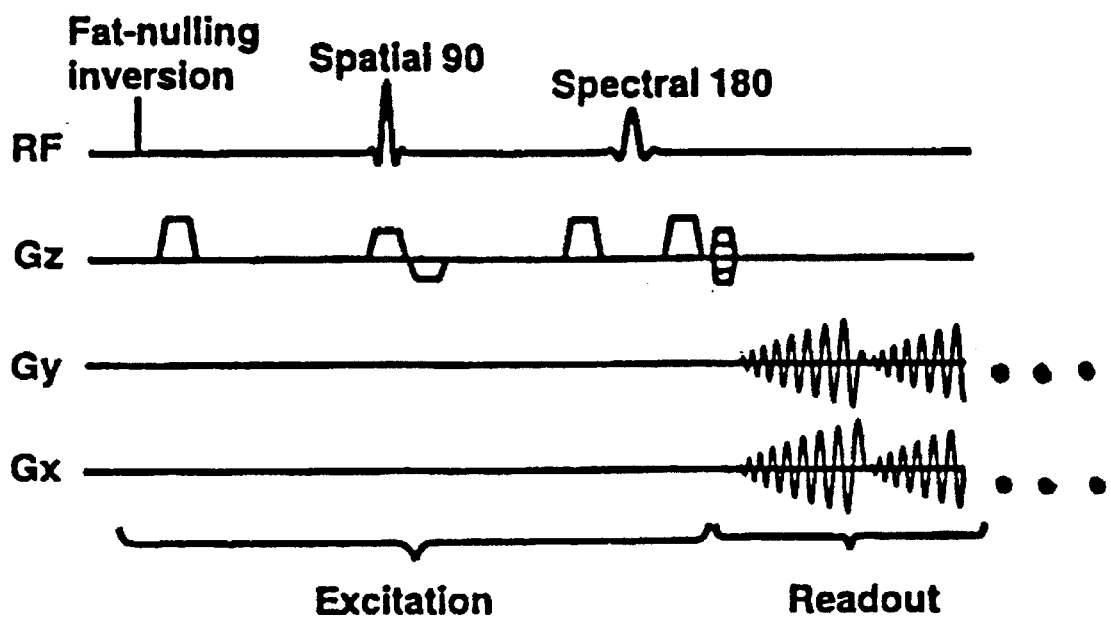
FIG. 4 illustrates a pulse sequence used in the three dimensional acquisition.

We demonstrated this method for spectroscopic imaging with a brain study to image low-SNR metabolites such as N-acetyl-aspartate (NAA), creatine, and choline. We used a standard GE Signa scanner, 1.5 T system with shielded gradients. The maximum gradient amplitude is 1× (G/cm), and the maximum slew rate of the gradients is 1.67× (G/cm×ms). To excite the desired metabolites we used the spin-echo sequence in FIG. 4 where inversion recovery is used for added lipid suppression. The 90° pulse is spatially selective in the z direction, while the 180° pulse is spectrally selective and provides water suppression. In our implementation we were interested in metabolites with long relaxation times, NAA, creatine and choline, and thus this excitation sequence was appropriate. In general, there is no restriction on the choice of the excitation sequence as long as the desired metabolites are appropriately excited and the unwanted lipid and water resonances are suppressed. The total imaging time is 17 minutes with TI=170 ms, TE=144 ms, TR=2 s. The nominal spatial resolution of this scan is 1.33 cm×1.33 cm for the in-plane dimensions (x and y), while the resolution in z is 0.625 cm, which results in a nominal voxel size of 1.1 cc. The in-plane FOV is 24 cm, and the FOV in the z dimension is 10 cm. Sixteen phase encodes were sampled in the $k_z$ dimension. The receiver bandwidth was 31.25 kHz; the spectral bandwidth of the reconstructed data was 400 Hz; and the readout time was 200 ms.

For these parameters, the entire k-space is scanned in 46 acquisitions. However, 512 acquisitions are necessary for adequate SNR, and the data must be re-acquired and averaged multiple times. In our implementation, the data was acquired on four interleaves in $(k_x, k_y)$ that effectively increase the FOV in (x, y) by a factor of four. The spectral bandwidth was interleaved for an effective spectral bandwidth of 650 Hz. Two averages were acquired with a sign change of the 90° excitation pulse between the two averages.

With the spiral spectroscopic acquisition method, the time to scan the entire k-space is dramatically decreased as compared to conventional methods. A spiral scan requires only 46 acquisitions (1.5 minutes scan time at TR=2 s) to collect data for 18×18×16 pixels over a 24×24×10 cm FOV. A conventional phase encoded three-dimensional spectroscopic method would require 4096 acquisitions to acquire data for the same resolution parameters (2 hours and 16 minutes scan time at TR=2 s).

Figure 6:
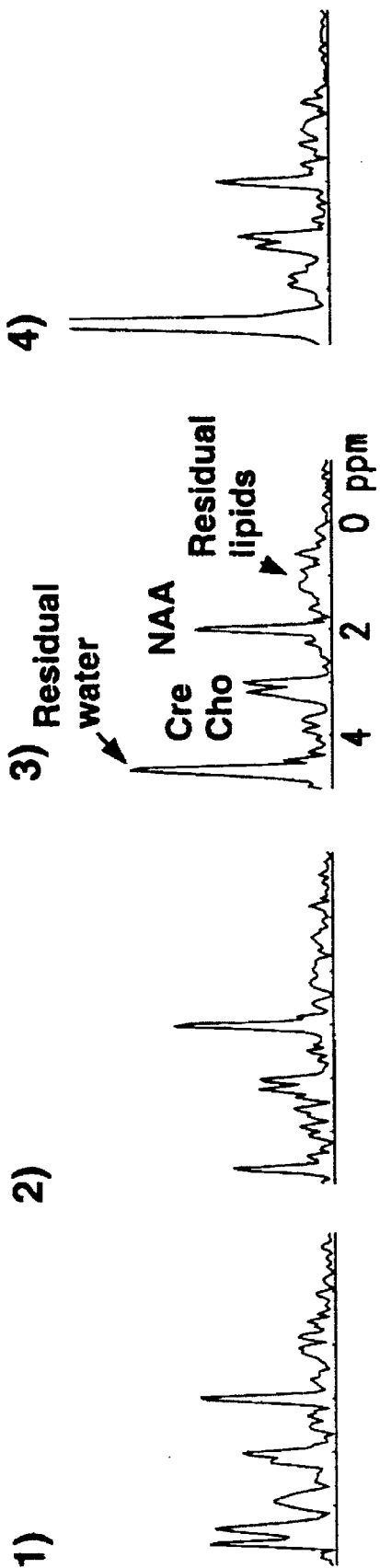
FIG. 6 are representative spectra from locations indicated in FIG. 5B.
Figure 5A:
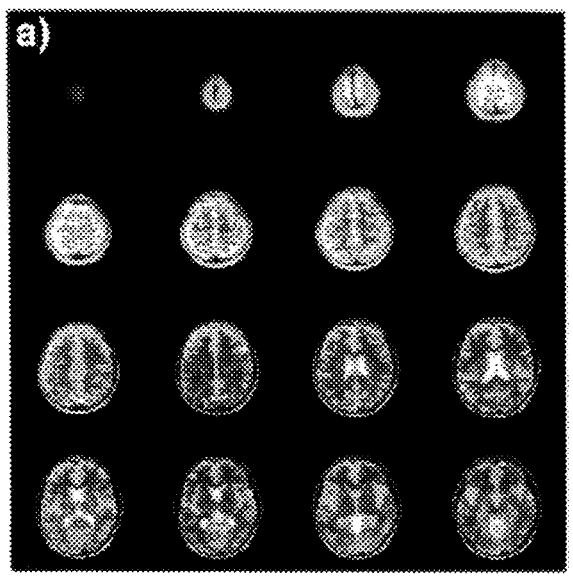
FIG. 5A illustrates T2 weighted images at slice locations of metabolite images.
Figure 5B:
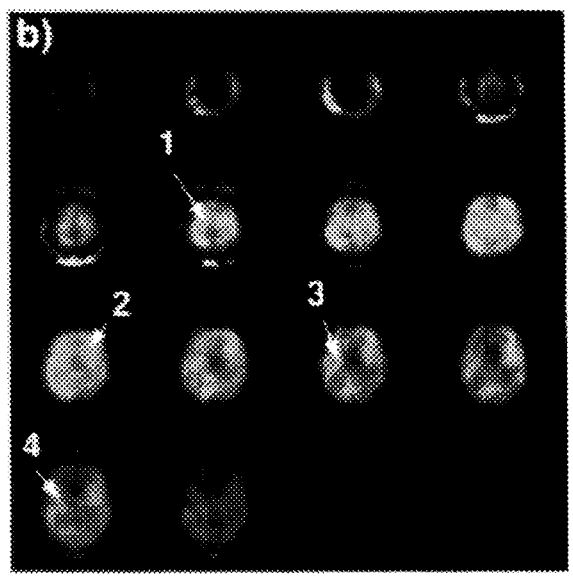
FIG. 5B illustrates NAA images from a normal volunteer acquired with the trajectory of FIGS. 3A–3C.

We scanned a healthy volunteer with this sequence, and an example of the results is shown in FIGS. 5A, 5B. In FIG. 5A, a set of $T_2$-weighted axial images is shown at the slice locations of the spectroscopic NAA images. FIG. 5B shows the NAA images, while the spectra of FIG. 6 are from the locations indicated in FIG. 5B. While data from 16 slices was collected with this acquisition, a conventional scan with the same voxel size and acquisition time could only have acquired a single slice. For this example, there is ample time to collect even more slices—32 slices could be acquired in the same total imaging time by reducing the number of averages by a factor of two, or reducing the number of interleaves by a factor of two.

Figure 7A:
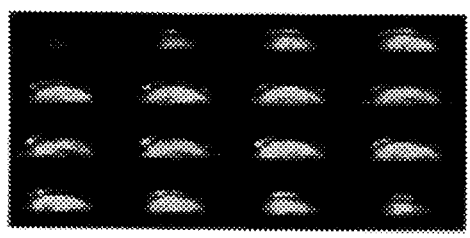
FIGS. 7A and 7B are respectively sagittal and coronal images that are reformatted from the data set shown in FIGS. 5A, 5B.
Figure 7B:
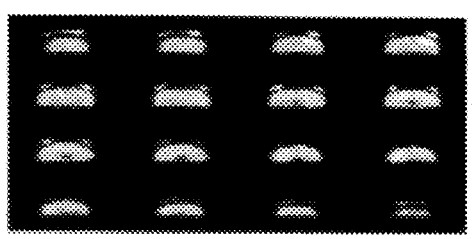

Since the data is acquired three dimensions without inter-slice gaps, the images can be viewed at an arbitrary angle. FIGS. 7A, 7B show examples of sagittal and coronal sections of the same data set as in FIGS. 5A, 5B.

There are several ways in which we can take advantage of this increased acquisition speed. We describe three applications here: 1) any type of excitation can precede the readout period with the time-varying gradients; 2) reliable, unambiguous reference maps can be collected rapidly in a separate scan to guide the reconstruction of the metabolite maps; and 3) multiple-quantum methods can be incorporated into a spectroscopic imaging sequence.

Arbitrary Excitation

We demonstrated the 3D spectroscopic spiral acquisition with a spin-echo sequence and inversion recovery for added lipid suppression. This particular excitation was chosen to observe signals from NAA, creatine and choline. More generally, any excitation scheme that excites the desired metabolites, while at the same time suppressing the unwanted lipid and water references, can be applied prior to the readout interval.

The choice of an excitation method depends on the desired level of lipid and water suppression, and the relaxation and coupling characteristics of the metabolites of interest. Examples include PRESS and STEAM preparation methods that have been widely used in the research community. Other examples are sequences that apply spectral-spatial pulses for water or lipid suppression, sequences that use spatial saturation for suppression of subcutaneous fat, or sequences that use chemical shift saturation of the water signal for water suppression.

Reference Maps

The spiral based acquisition can be used to rapidly acquire an image of the high-SNR components of water and lipids. Thus, one can rapidly collect a frequency reference that does not suffer from water/fat ambiguities as is the case with conventional methods. This rapid reference collection also can have a spatial impulse response that is identical to the spectroscopic acquisition, and thus provides reliable and robust chemical shift and $T^*_2$ information for each spectroscopic voxel. The chemical shift information is crucial to an automatic reconstruction of metabolite maps in the presence of main field inhomogeneities. Thus, the rapidly collected reference data is an important component in automatic and reliable reconstruction of spectroscopic images.

A reference map of this type was used to reconstruct the NAA data in FIG. 5B. The reference data proved to be a reliable and robust source of chemical shift information. The acquisition of the reference data required 46 acquisitions, or less than 30 s at TR=500 ms. The reference data does not need to be acquired at the same (long) TR as the spectroscopic data, rather, a much shorter TR can be used.

The spiral-based method can be used to collect spectroscopic data for a single slice as well as three dimensions, by sampling only the central plane in $k_z$. For the given in-plane resolution parameters, the entire k-space can be acquired in only four acquisitions. Thus, a spectroscopic reference map for a two-dimensional acquisition can be acquired in a very short time.

Incorporation of Multiple-Quantum Editing Methods into a Spectroscopic Imaging Sequence A class of spectroscopic methods has been developed to alter the evolution of spins based on their coupling characteristics. These methods have been termed 2D spectroscopy, multidimensional spectroscopy, or multiple-quantum editing methods.

Most of the methods that employ multiple-quantum detection, rely on a collection of series of acquisitions where a time delay period, $t_1$, is varied from one acquisition to the next. Following the delay period, the spectroscopic data is sampled during the acquisition period, $t_2$. Coupled spins accrue phase at a different rate from uncoupled spins during $t_1$, and this phase difference forms the basis of the multiple-quantum editing techniques. An FFT of the $(t_1, t_2)$ data reveals spectral peaks in the $(f_1, f_2)$ plane whose locations and shape depend on the chemical shift, relaxation parameters, and coupling characteristics of the observed spins.

Figure 8:
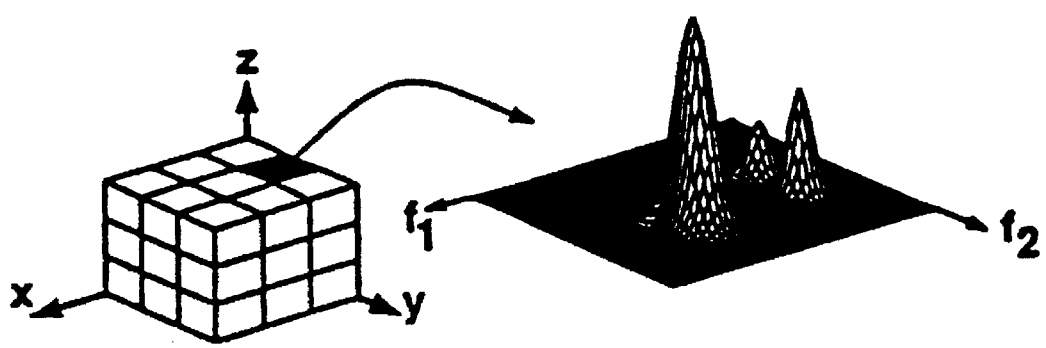
FIG. 8 is a schematic illustration from a multiple quantum experiment incorporated into a three dimensional spectroscopic imaging sequence.

Since the $t_1$ encoding requires several acquisitions for adequate discrimination along the $f_1$ dimension, these methods are too time consuming for a conventional scan to have adequate spatial resolution. The spiral acquisition, however, offers the incorporation of a multiple-quantum resolved acquisition into an imaging sequence with a flexible choice of imaging time and spatial resolution. A three-dimensional acquisition with multiple quantum editing can be implemented on a standard clinical scanner with 16 steps in the $t_1$ dimension. A schematic illustration is given in FIG. 8. Furthermore, for a spatially two-dimensional acquisition where only the central $k_z$ plane is acquired, many more $t_1$ steps can be incorporated. Additionally, RF phase cycling schemes that increase the immunity of these sequences to system imperfections could be incorporated as well.

There has been described a rapid data acquisition method that applies spiral-based k-space trajectories to spectroscopic imaging. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of magnetic resonance spectroscopic imaging (MRSI) comprising the steps of:
   a) placing an object to be imaged in a magnetic field aligned along an axis (z),
   b) exciting nuclei in said body to excite desired spectral components for imaging,
   c) applying time-varying gradients ($G_x$, $G_y$) along two axes to define a first plurality of spiral trajectories in k-space with said spiral trajectories extending along a frequency axis in k-space ($k_f$), and
   d) detecting signals emitted by said spectral components.

2. The method as defined by claim 1 and further including the step of:
   e) repeating steps b), c), and d) with the time-varying gradients of step c) altered in time relative to signal echo time whereby a second plurality of spiral trajectories in k-space is defined which is interleaved with said first plurality of spiral trajectories.

3. The method as defined by claim 2 wherein step c) includes applying a gradient pulse along a third axis (z) to define a plane orthogonal to an axis in k-space ($k_z$) in which said plurality of spiral trajectories are located.

4. The method as defined by claim 3 wherein in step e) said gradient along a third axis is altered in amplitude for each repetition thereby defining a plurality of planes along said axis in k-space ($k_z$) in which each plurality of spiral trajectories are located.

5. The method as defined by claim 4 wherein said planes of spiral trajectories provide a spherical coverage in ($k_x$, $k_y$, $k_z$)-space.

6. The method as defined by claim 4 wherein said planes of spiral trajectories provide a cylindrical coverage in ($k_x$, $k_y$, $k_z$)-space.

7. Apparatus for magnetic resonance spectroscopic imaging (MRSI) comprising:
   a) means for establishing a magnetic field aligned along an axis (z) through an object to be imaged,
   b) means for selectively exciting nuclei in said body to excite desired spectral components for imaging,
   c) means for applying time-varying gradients ($G_x$, $G_y$) along two axes to define a first plurality of spiral trajectories in k-space with said spiral trajectories extending along a frequency axis in k-space ($k_f$), and
   d) a detector for detecting signals emitted by said spectral components.

8. Apparatus as defined by claim 7 wherein said means for applying time-varying gradients alters said gradients relative to signal echo time whereby a second plurality of spiral trajectories in k-space is defined which is interleaved with said first plurality of spiral trajectories.

9. Apparatus as defined by claim 8 wherein said means for applying time-varying gradients applies a gradient pulse along a third axis (z) to define a plane orthogonal to an axis in k-space ($k_z$) in which said plurality of spiral trajectories are located.

10. Apparatus as defined by claim 9 wherein said gradient along a third axis is altered in phase for each repetition thereby defining a plurality of planes along said axis in k-space ($k_z$) in which each plurality of spiral trajectories are located.

11. Apparatus as defined by claim 10 wherein said planes of spiral trajectories provide a spherical coverage in ($k_x$, $k_y$, $k_z$)-space.

12. Apparatus as defined by claim 10 wherein said planes of spiral trajectories provide a cylindrical coverage in ($k_x$, $k_y$, $k_z$)-space.

* * * * *